United States Patent
Skelton

(10) Patent No.: US 8,749,201 B2
(45) Date of Patent: Jun. 10, 2014

(54) BATTERY PACK CAPACITY LEARN ALGORITHM

(75) Inventor: Scott M. Skelton, Belleville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 826 days.

(21) Appl. No.: 12/898,324

(22) Filed: Oct. 5, 2010

(65) Prior Publication Data
US 2012/0081075 A1    Apr. 5, 2012

(51) Int. Cl.
*H02J 7/00*    (2006.01)

(52) U.S. Cl.
USPC ........... 320/116; 320/132; 320/134; 320/136; 320/104; 180/65.1

(58) Field of Classification Search
USPC ......... 320/116, 132, 134, 136, 104; 180/65.1, 180/65.21
See application file for complete search history.

(56) References Cited

U.S. PATENT DOCUMENTS

| | | | | |
|---|---|---|---|---|
| 7,091,698 B2 * | 8/2006 | Yamazaki et al. | | 320/132 |
| 7,193,391 B2 * | 3/2007 | Moore | | 320/116 |
| 7,321,220 B2 * | 1/2008 | Plett | | 320/128 |
| 7,525,285 B2 * | 4/2009 | Plett | | 320/132 |
| 7,609,030 B2 * | 10/2009 | Uesugi et al. | | 320/118 |
| 7,956,580 B2 * | 6/2011 | Sugimoto | | 320/132 |
| 7,982,432 B2 * | 7/2011 | Salman et al. | | 320/130 |
| 8,232,770 B2 * | 7/2012 | Okumura | | 320/132 |
| 2007/0114972 A1 * | 5/2007 | Koo | | 320/132 |
| 2009/0273313 A1 * | 11/2009 | Scott et al. | | 320/134 |
| 2009/0322283 A1 * | 12/2009 | Zhang et al. | | 320/134 |
| 2011/0080138 A1 * | 4/2011 | Nakanishi | | 320/116 |

FOREIGN PATENT DOCUMENTS

DE    10 2004 023 542 A1    12/2005

* cited by examiner

*Primary Examiner* — Drew A Dunn
*Assistant Examiner* — Michael Dibenedetto
(74) *Attorney, Agent, or Firm* — John A. Miller; Miller IP Group, PLC

(57) ABSTRACT

A method that considers battery capacity for providing cell balancing for battery cells in a battery pack. The method includes providing a current state-of-charge for each battery cell in the battery pack for a current time frame and a previous state-of-charge for each battery cell in the battery pack from a previous time frame. The method also includes subtracting the current state-of-charge from the previous state-of-charge for each battery cell to generate a cell delta state-of-charge for each cell and providing an average cell delta state-of-charge of the cell delta state-of-charges for all of the cells. The method also includes dividing each cell delta state-of-charge by the average cell delta state-of-charge to provide a relative cell delta state-of-charge for each cell and dividing the current state-of-charge by the relative cell delta state-of-charge for that cell to generate a capacity adjustment state-of-charge that identifies the capacity of the cell.

20 Claims, 1 Drawing Sheet

BATTERY PACK CAPACITY LEARN ALGORITHM

BACKGROUND OF THE INVENTION

1. Field of the Invention

This invention relates generally to a system and method for providing battery cell balancing and, more particularly, to a system and method that provides battery cell balancing using changes in state-of-charge (SOC) of each cell in the battery to determine the relative capacity of these cells.

2. Discussion of the Related Art

Electric vehicles are becoming more and more prevalent. These vehicles include hybrid vehicles, such as the extended range electric vehicles (EREV) that combine a battery and a main power source, such as an internal combustion engine, fuel cell systems, etc., and electric only vehicles, such as the battery electric vehicles (BEV). All of these types of electric vehicles employ a high voltage battery that includes a number of battery cells. These batteries can be different battery types, such as lithium ion, nickel metal hydride, lead acid, etc. A typical high voltage battery system for an electric vehicle may include a large number of battery cells or modules including several battery cells to meet the vehicle power and energy requirements. The battery system can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

When a battery pack is relatively new, each cell in the battery pack typically operates at about the same level of performance, i.e., maximum charge or capacity. However, as the battery pack ages over time, each cell typically degrades in performance differently than the other cells, where the performance of the battery pack is limited by the performance of the lowest performing cell. Further, a battery cell or battery module in the battery pack may fail or may otherwise be limited in performance for other reasons, such as an internal short, loss of capacity, high resistance, high temperature, etc. If a failing cell or module can be identified, it may be possible to replace that particular cell or module without replacing the entire battery pack because it is generally cheaper to replace a single cell or group of cells than the whole battery pack. However, the new battery cell or module would not be at the same level of performance as the other battery cells in the battery pack, and therefore, the new cell needs to be matched in performance for proper operation of the battery.

Electric vehicles typically include cell balancing algorithms that control the charging of the battery so that the state-of-charge of the battery cells is about the same. Known cell balancing algorithms only look at cell state-of-charge, and not cell capacity, where the algorithm identifies the capacity of the cells as the same or nearly the same. When new battery cells are added to the battery pack, the cell balancing algorithm does not treat the new cells any different than the old cells so that during the charging sequence, the state-of-charge of the degraded cells will increase faster. This causes the cell balancing algorithm to discharge the higher state-of-charge cells faster, which are the cells that have the lower capacity, which causes them to be discharged too much during operation of a vehicle. Thus, improvements in cell balancing algorithms can be provided that will operate to extend the useful life of a battery pack.

SUMMARY OF THE INVENTION

In accordance with the teachings of the present invention, a system and method are disclosed that considers battery capacity for providing cell balancing for battery cells in a battery pack. The method includes providing a current state-of-charge for each battery cell in the battery pack for a current time frame and a previous state-of-charge for each battery cell in the battery pack from a previous time frame. The method also includes subtracting the current state-of-charge from the previous state-of-charge for each battery cell to generate a cell delta state-of-charge for each cell and providing an average cell delta state-of-charge of the cell delta state-of-charges for all of the cells. The method also includes dividing each cell delta state-of-charge by the average cell delta state-of-charge to provide a relative cell delta state-of-charge for each cell and dividing the current state-of-charge by the relative cell delta state-of-charge for that cell to generate a capacity adjustment state-of-charge that identifies the capacity of the cell. The capacity adjusted state-of-charge for each cell can be used in a cell balancing algorithm that balances the state-of-charge of each cell in the battery pack to be about the same. Further, the method can include generating a capacity fade factor that identifies the age of the battery pack based on a theoretical state-of-charge of the battery pack and a measured state-of-charge of the battery pack.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for adjusting cell capacity for the cells in a battery pack for cell balancing algorithm is merely exemplary in nature, and is in no way intended to limit the invention or its application or uses. For example, the system and method described below is for a high voltage vehicle battery. However, as will be appreciated by those skilled in the art, the cell balancing algorithm of the invention may have application for other batteries that require cell balancing.

Figure 1:
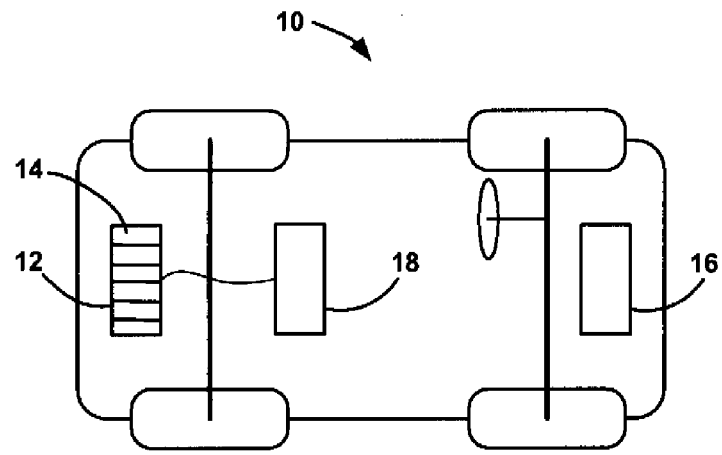
FIG. 1 is a top plan view of a vehicle including a vehicle battery.

FIG. 1 is a top plan view of a vehicle 10 intended to represent an electric vehicle or an electric hybrid vehicle. The vehicle 10 includes a high voltage battery 12 mounted to a suitable support within the vehicle 10, where the battery 12 includes a plurality of battery cells 14. The battery 12 can be any battery suitable for an electric vehicle, such as a lead-acid battery, lithium-ion battery, metal hydride battery, etc. The vehicle 10 may also include a separate power source 16, such as an internal combustion engine, fuel cell system, etc.

Figure 2:
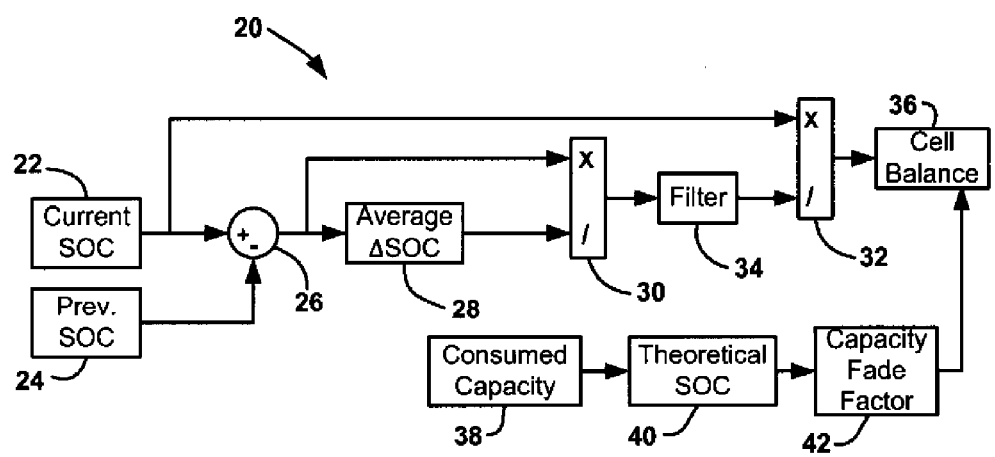
FIG. 2 is a block diagram of a system and method for providing battery cell balancing that considers cell capacity.

FIG. 2 is a block diagram illustrating a method and system 20 for a capacity variation algorithm that identifies cell capacity for each cell in a battery pack, such as battery 12. The current state-of-charge (SOC) from a current time frame of each battery cell 14 is provided at box 22 and a previous SOC from a previous time frame of each battery cell 14 is provided at box 24. In one embodiment, a cell SOC measurement is provided at initialization of the algorithm where the previous SOC is from the previous initialization. For each cell 14, the current and previous SOC values are subtracted at a difference junction 26 to get the difference of the SOCs of each cell 14, referred to as cell delta SOC, over the last charging and discharging sequence of the cell 14. The cell delta SOC for all of the cells 14 over the last charging and discharging sequence is averaged at box 28 to generate an average cell delta SOC that is sent to box 30 along with all of the separate cell delta SOCs from the junction 26, where all of the cell delta SOCs are divided by the average cell delta SOC to get a relative cell delta SOC for each cell 14. Thus, for each cell delta SOC that is at the average delta SOC, the relative cell delta SOC will be 1, and depending on whether the cell delta SOC is above or below the average cell delta SOC will determine whether that relative cell delta SOC is less than or greater than 1. In other words, the higher SOC cells will have a relative cell delta SOC less than 1 and the lower SOC cells will have a relative cell delta SOC greater than 1.

The current SOC for each cell 14 from the box 22 is also sent to box 32 as an observed cell SOC, where each observed cell SOC for each cell 14 is divided by the relative cell delta SOC for that cell from the box 30. The relative delta SOC is sent through a filter 34, for example, an exponentially weighted moving average filter, well known to those skilled in art, to reduce the impact of any relative delta SOC that may be significantly outside the normal operation so that this type of data does not significantly affect the cell balancing algorithm. Thus, depending on whether the particular cell 14 is a higher performing cell or a lower performing cell, which determines whether its relative cell delta SOC is greater than or less than 1, the cell SOC will be adjusted up or down so that the capacity of the higher performing cells will be increased and the capacity of the lower performing cells will be reduced. The capacity adjusted cell SOC for each cell from the box 32 is then sent to box 36 that represents a cell balancing algorithm operating in a battery controller 18.

It is noted that the capacity adjusted SOC algorithm discussed herein applies to both charging and discharging of the battery 12. Therefore, the algorithm is applicable for the battery 12 reaching both a maximum and minimum state-of-charge.

The cell capacity adjustment described above can be shown by three cases including Case 1 for a high capacity cell, Case 2 for a low capacity cell, and Case 3 for an average capacity cell. For Case 1, the cell delta SOC is less than the average cell delta SOC so that the relative cell delta SOC from the box 30 is less than 1. Thus, the observed cell SOC divided by the relative cell delta SOC in the box 32 would be greater than the observed cell SOC. For Case 2, the cell delta SOC is greater than the average cell delta SOC so that the relative cell delta SOC from the box 30 is greater than 1. Thus, the observed cell SOC divided by the relative cell delta SOC from the box 32 is less than the observed cell SOC. For Case 3, the cell delta SOC divided by the average cell delta SOC is equal to 1 so that the observed cell SOC divided by the relative cell delta SOC is the observed cell SOC.

As discussed above, current cell balancing algorithms assume a fixed battery pack capacity or a linear battery pack capacity degradation over time. Therefore, the actual capacity of the battery pack is not specifically known as the battery pack ages. As discussed above, if the battery pack state-of-charge is less than the predicted state-of-charge as a result of aging, then the battery pack will be charged more than its capacity, which further decreases its life. In addition to the capacity adjustment for each cell in the battery pack, the present invention also calculates a battery pack capacity fade factor as an input for the cell balancing algorithm in the box 36 that identifies a reduction in battery pack capacity as it ages.

To determine the battery pack capacity fade factor, the capacity consumed by the battery pack is determined at box 38 based on the current flowing into and out of the battery pack as:

$$\int_{t_{on}}^{t_{off}} I_{pack} dt = \text{Capacity}_{consumed}(Ahr) \quad (1)$$

Where $t_{on}$ is the on time of the battery pack, $t_{off}$ is the off time of the battery pack, $I_{pack}$ is the flow of the current into and out of the battery, and $\text{Capacity}_{consumed}$ is the amount of current consumed by the battery pack, where if the battery pack is being charged to increase its capacity, this value is negative.

The capacity of the battery pack identified by $\text{Capacity}_{consumed}$ is then divided by a theoretical or known capacity $\text{Capacity}_{theoretical}$ of the battery pack at box 40 to get a theoretical change in the SOC $\Delta SOC_{theoretical}$ of the battery pack as:

$$\Delta SOC_{theoretical} = \frac{\text{Capacity}_{consumded}}{\text{Capacity}_{theoretical}} \quad (2)$$

The known capacity $\text{Capacity}_{theoretical}$ of the battery pack can be determined in any suitable manner, such as parameters provided by the battery manufacturer.

The capacity fade factor is than calculated at box 42 as the change in the SOC of the battery pack divided by the measured change in the SOC $\Delta SOC_{meas}$ in the battery pack as:

$$\text{Capacity\_Fade\_Factor} = \frac{\Delta SOC_{theoretical}}{\Delta SOC_{meas}} \quad (3)$$

The capacity fade factor is then provided to the cell balancing algorithm at the box 36 to improve the cell balancing by knowing the actual capacity of the battery pack as it fades over time. In other words, the capacity fade factor allows the cell balancing algorithm to change the amount that the battery pack is charged so that the battery pack is fully charged, without over-shooting the maximum state-of-charge.

Although the discussion above determines the capacity fade factor for the whole battery pack, the same analysis can be performed based on the current flow into and out of a specific battery cell to determine the capacity fade factor for that cell in the same manner. It is noted that the capacity fade factor discussed above can be used for battery production purposes to ensure that the battery has an acceptable capacity for its application when it is being manufactured. Further, the capacity fade factor can be used for service purposes to identify when the battery has reached its end of life (EOL).

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining a capacity of battery cells in a battery pack, said method comprising:

providing a current state-of-charge for each battery cell in the battery pack for a current time frame and a previous state-of-charge for each battery cell in the battery pack for a previous time frame;

subtracting the current state-of-charge from the previous state-of-charge for each battery cell to generate a cell delta state-of-charge for each cell;

providing an average cell delta state-of-charge for the cell delta state-of-charges from all of the cells;

dividing each cell delta state-of-charge by the average cell delta state-of-charge to provide a relative cell delta state-of-charge for each cell; and dividing, using a microprocessor, the current state-of-charge for each cell by the relative cell delta state-of-charge for that cell to generate a capacity adjusted state-of-charge that identifies the capacity of the cell.

2. The method according to claim 1 further comprising filtering the relative delta state-of-charge for each cell so as to reduce the impact of large changes in the relative delta state-of-charge.

3. The method according to claim 2 wherein filtering the relative cell delta state-of-charge includes using an exponentially weighted moving average filter.

4. The method according to claim 1 further comprising using the capacity adjusted state-of-charge for each cell in a cell balancing algorithm that balances the state-of-charge of each cell in the battery pack to be about the same.

5. The method according to claim 1 further comprising generating a capacity fade factor that identifies the age of the battery pack.

6. The method according to claim 5 wherein generating a capacity fade factor includes determining a capacity of the battery pack by determining current flow into and out of the battery pack to determine a battery pack capacity consumed, dividing the battery pack capacity consumed by a theoretical or known capacity of the battery pack to get a change in the state-of-charge of the battery pack, and dividing the change in the state-of-charge of the battery pack by a measured change in state-of-charge of the battery pack to get the capacity fade factor.

7. The method according to claim 1 wherein the battery pack is a high voltage battery pack for an electric vehicle.

8. The method according to claim 7 wherein the high voltage battery pack is a lithium-ion battery pack.

9. A method for determining a capacity of battery cells in a battery pack in an electric vehicle, said method comprising:

providing a current state-of-charge for each battery cell in the battery pack for a current time frame and a previous state-of-charge for each battery cell in the battery pack for a previous time frame;

subtracting the current state-of-charge from the previous state-of-charge for each battery cell to generate a cell delta state-of-charge for each cell;

providing an average cell delta state-of-charge for the cell delta state-of-charges from all of the cells;

dividing each cell delta state-of-charge by the average cell delta state-of-charge to provide a relative cell delta state-of-charge for each cell;

dividing the current state-of-charge for each cell by the relative cell delta state-of-charge for that cell to generate a capacity adjusted state-of-charge that identifies the capacity of the cell;

generating a capacity fade factor that identifies the age of the battery pack; and using the capacity adjusted state-of-charge for each cell and the capacity fade factor in a cell balancing algorithm that balances the state-of-charge of each cell in the battery pack to be about the same.

10. The method according to claim 9 further comprising filtering the relative delta state-of-charge for each cell so as to reduce the impact of large changes in the relative delta state-of-charge.

11. The method according to claim 10 wherein filtering the relative cell delta state-of-charge includes using an exponentially weighted moving average filter.

12. The method according to claim 9 wherein generating a capacity fade factor includes determining a capacity of the battery pack by determining current flow into and out of the battery pack to determine a battery pack capacity consumed, dividing the battery pack capacity consumed by a theoretical or known capacity of the battery pack to get a change in the state-of-charge of the battery pack, and dividing the change in the state-of-charge of the battery pack by a measured change in state-of-charge of the battery pack to get the capacity fade factor.

13. A system for determining a capacity of battery cells in a battery pack, said system comprising;

means for providing a current state-of-charge for each battery cell in the battery pack for a current time frame and means for providing a previous state-of-charge for each battery cell in the battery pack for a previous time frame;

means for subtracting the current state-of-charge from the previous state-of-charge for each battery cell to generate a cell delta state-of-charge for each cell;

means for providing an average cell delta state-of-charge for the cell delta state-of-charges from all the cells;

means for dividing each cell delta state-of-charge by the average cell delta state-of-charge to provide a relative cell delta state-of-charge for each cell; and means for dividing the current state-of-charge from each cell by the relative cell delta state-of-charge for that cell to determine a capacity adjusted state-of-charge that identifies the capacity of the cell.

14. The system according to claim 13 further comprising means for filtering the relative delta state-of-charge for each cell to reduce the impact of large changes in the relative delta state-of-charge.

15. The system according to claim 14 wherein the means for filtering the relative cell delta state-of-charge includes uses an exponentially weighted moving average filter.

16. The system according to claim 13 further comprising means for using the capacity adjusted state-of-charge for each cell in a cell balancing algorithm that balances the state-of-charge of each cell in the battery pack to be about the same.

17. The system according to claim 13 further comprising means for generating a capacity fade factor that identifies the age of the battery pack.

18. The system according to claim 17 wherein the means for generating a capacity fade factor determines a capacity of the battery pack by determining current flow into and out of the battery pack to determine a battery pack capacity consumed, divides the battery pack capacity consumed by a theoretical or known capacity of the battery pack to get a change in the state-of-charge of the battery pack, and divides the change in the state-of-charge of the battery pack by a measured change in state-of-charge of the battery pack to get the capacity fade factor.

19. The system according to claim 13 wherein the battery pack is a high voltage battery pack for an electric vehicle.

20. The system according to claim 19 wherein the high voltage battery pack is a lithium-ion battery pack.

* * * * *